US012340495B2

(12) United States Patent
Pang et al.

(10) Patent No.: US 12,340,495 B2
(45) Date of Patent: Jun. 24, 2025

(54) METHOD FOR COMPUTATIONAL METROLOGY AND INSPECTION FOR PATTERNS TO BE MANUFACTURED ON A SUBSTRATE

(71) Applicant: D2S, Inc., San Jose, CA (US)

(72) Inventors: Linyong Pang, Monte Sereno, CA (US); Jocelyn Blair, Campbell, CA (US); Ajay Baranwal, Dublin, CA (US)

(73) Assignee: D2S, Inc., San Jose, CA (US)

( * ) Notice: Subject to any disclaimer, the term of this patent is extended or adjusted under 35 U.S.C. 154(b) by 365 days.

(21) Appl. No.: 17/816,910

(22) Filed: Aug. 2, 2022

(65) Prior Publication Data

US 2023/0037918 A1 Feb. 9, 2023

Related U.S. Application Data

(60) Provisional application No. 63/260,039, filed on Aug. 6, 2021.

(51) Int. Cl.
*G06T 7/00* (2017.01)
*G03F 1/84* (2012.01)
(Continued)

(52) U.S. Cl.
CPC .............. *G06T 7/0004* (2013.01); *G03F 1/84* (2013.01); *G06N 3/045* (2023.01); *G06T 7/70* (2017.01);
(Continued)

(58) Field of Classification Search
CPC .................... G06T 7/0004; G06T 7/70; G06T 2207/10032; G06T 2207/10061;
(Continued)

(56) References Cited

U.S. PATENT DOCUMENTS 11,250,199 B1 * 2/2022 Pillai ...................... G06N 3/088
11,900,026 B1 * 2/2024 Schubert ................ G06N 3/045
(Continued)

FOREIGN PATENT DOCUMENTS

| CN | 1043646605 | * | 6/2017 | ............. G01B 11/24 |
| CN | 111480179 | * | 7/2020 | ............. G06T 7/001 |

(Continued)

OTHER PUBLICATIONS

Pang, et al., "Bridging the gaps between mask inspection/review systems and actual wafer printability using computational metrology and inspection (CMI) technologies", Proceedings of Spie, Nov. 8, 2012, 16 pgs, SPIE Photomask Technology, 2012, Monterey, California, United States.

*Primary Examiner* — Jerome Grant, II
(74) *Attorney, Agent, or Firm* — MLO, a professional corp.

(57) ABSTRACT

Methods include generating a scanner aerial image using a neural network, where the scanner aerial image is generated using a mask inspection image that has been generated by a mask inspection machine. Embodiments also include training the neural network with a set of images, such as with a simulated scanner aerial image and another image selected from a simulated mask inspection image, a simulated Critical Dimension Scanning Electron Microscope (CD-SEM) image, a simulated scanner emulator image and a simulated actinic mask inspection image.

11 Claims, 15 Drawing Sheets

(51) Int. Cl.
*G06N 3/045* (2023.01)
*G06T 7/70* (2017.01)

(52) U.S. Cl.
CPC ............. *G06T 2207/10032* (2013.01); *G06T 2207/10061* (2013.01); *G06T 2207/20081* (2013.01); *G06T 2207/20084* (2013.01); *G06T 2207/30148* (2013.01)

(58) Field of Classification Search
CPC . G06T 2207/20081; G06T 2207/20084; G06T 2207/30148; G06T 2207/20016; G03F 1/84; G03F 7/705; G03F 7/70666; G06N 3/045; G06N 3/048; G06N 3/0475; G06N 3/094; G06N 3/0464
USPC ........................................................ 382/144
See application file for complete search history.

(56) References Cited

U.S. PATENT DOCUMENTS

| | | | |
|---|---|---|---|
| 2020/0018944 A1* | 1/2020 | Fang | G06N 3/045 |
| 2020/0151538 A1* | 5/2020 | Sha | G06V 10/774 |
| 2021/0286270 A1* | 9/2021 | Middlebrooks | G06N 3/047 |
| 2021/0304400 A1* | 9/2021 | Bhate | G06F 18/2148 |
| 2021/0342991 A1* | 11/2021 | Jacob | G06T 7/30 |
| 2022/0180497 A1* | 6/2022 | Scheidegger | G06T 3/40 |

FOREIGN PATENT DOCUMENTS

| | | | | |
|---|---|---|---|---|
| JP | 2009525504 | * | 7/2009 | |
| TW | 202113501 | * | 4/2021 | ......... G03F 7/70625 |
| WO | WO2021052918 | * | 3/2021 | ............. G06T 7/00 |
| WO | WO2022013302 | * | 1/2022 | |

* cited by examiner

METHOD FOR COMPUTATIONAL METROLOGY AND INSPECTION FOR PATTERNS TO BE MANUFACTURED ON A SUBSTRATE

RELATED APPLICATIONS

This application claims priority to U.S. Provisional Application No. 63/260,039, filed on Aug. 6, 2021, and entitled "Method for Computational Metrology and Inspection for Patterns to Be Manufactured on a Substrate"; the contents of which are hereby incorporated by reference.

BACKGROUND

The present disclosure is related to lithography, and more particularly to the design and manufacture of a surface which may be a reticle, a wafer, or any other surface, using charged particle beam lithography.

In lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns, the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the important widths or areas of a feature or the important space between two features or important space areas, those dimensions requiring exquisite control. Due to the nature of integrated circuit designs, many patterns in a design are repeated in different locations. A pattern may be repeated hundreds or thousands of times—each copy of the pattern is called an instance. If a design rule violation is found in such a pattern, the hundreds or thousands of violations may be reported—one for each instance of the pattern.

One goal in integrated circuit fabrication by optical lithography is to reproduce the original circuit design on a substrate by use of a reticle, in which the reticle, sometimes referred to as a mask or a photomask, is a surface which may be exposed using charged particle beam lithography. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. Resolution enhancement technologies performed with a reticle include OPC and inverse lithography technology (ILT).

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is added to improve pattern transference is referred to as "serifs." Serifs are small features that enhance precision or resiliency to manufacturing variation of printing of a particular feature. An example of a serif is a small feature that is positioned on a corner of a pattern to sharpen the corner in the final transferred image. Patterns that are intended to print on the substrate are referred to as main features. Serifs are a part of a main feature. It is conventional to discuss the OPC-decorated patterns to be written on a reticle in terms of main features, that is features that reflect the design before OPC decoration, and OPC features. OPC features might include serifs, jogs, sub-resolution assist features (SRAFs) and negative features. OPC features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process.

In optical lithography, the manufacture of the desired pattern on the reticle or photomask is a critical step. Since the pattern on the photomask is replicated during the optical lithographic process, there can be no defects on the photomask that will cause a defect to be printed onto the substrate during the optical lithography step. Therefore, newly manufactured photomasks are inspected to detect such potential defects. Potential defects are further analyzed, to determine if the defect is a real defect that must be repaired before using the mask in production.

SUMMARY in some embodiments, a method for determining a scanner aerial image from a mask inspection image includes inputting the mask inspection image, wherein the mask inspection image has been generated by a mask inspection machine. The scanner aerial image is generated from the mask inspection image using a neural network.

In some embodiments, a method for determining a scanner aerial image includes inputting a set of images and training a neural network with the set of images to generate the scanner aerial image. A first image in the set of images is selected from the group consisting of a simulated mask inspection image, a simulated Critical Dimension Scanning Electron Microscope (CD-SEM) image, a simulated scanner emulator image and a simulated actinic mask inspection image. A second image in the set of images is a simulated scanner aerial image. The neural network is trained with the first image and the second image to generate the scanner aerial image.

In some embodiments, a method for determining a scanner aerial image from a mask inspection image includes inputting the mask inspection image, wherein the mask inspection image is generated by a mask inspection machine. A mask image is generated from the mask inspection image using a first neural network. The scanner aerial image is generated from the mask image using a second neural network.

DETAILED DESCRIPTION OF EMBODIMENTS

Conventional Techniques

In conventional deep ultraviolet (DUV) techniques, mask pattern inspection tools are used to capture mask defects, then DUV emulation is used to predict defect printability under DUV scanner conditions. In extreme ultraviolet (EUV), actinic mask pattern inspection has been developed to capture mask defects under the same wavelength as an EUV scanner. However, since the actinic EUV mask inspection uses different optics than the EUV scanner, it cannot accurately predict the defect printability for EUV scanners. Differences between EUV mask inspection and EUV scanners include:

Amplified vs reduction optics

Fixed illuminations vs free form illumination

Numerical Aperture (NA), sigmas are different

While this disclosure addresses solutions for EUV, they may also apply to DUV.

In the study "Bridging the gaps between mask inspection/review systems and actual wafer printability using computational metrology and inspection (CMI) technologies" by Pang et al. (Proc. SPIE 8522, Photomask Technology 2012, 85220Z, Nov. 8, 2012), scanner emulator images for four different illuminators were simulated for a programmed defect mask design. The simulated CD errors for those illuminators included a bull's eye, a parametric source, and two free-form sources. It was shown that the trends of CD errors among those illuminations are different even for the same type of defects. Therefore, one cannot use scanner emulator images captured for one illumination to predict CD errors for another with a simple mapping. Instead, the mask pattern and defects need to be recovered from one illuminator, and then used to simulate scanner emulator images for the others.

Figure 1:
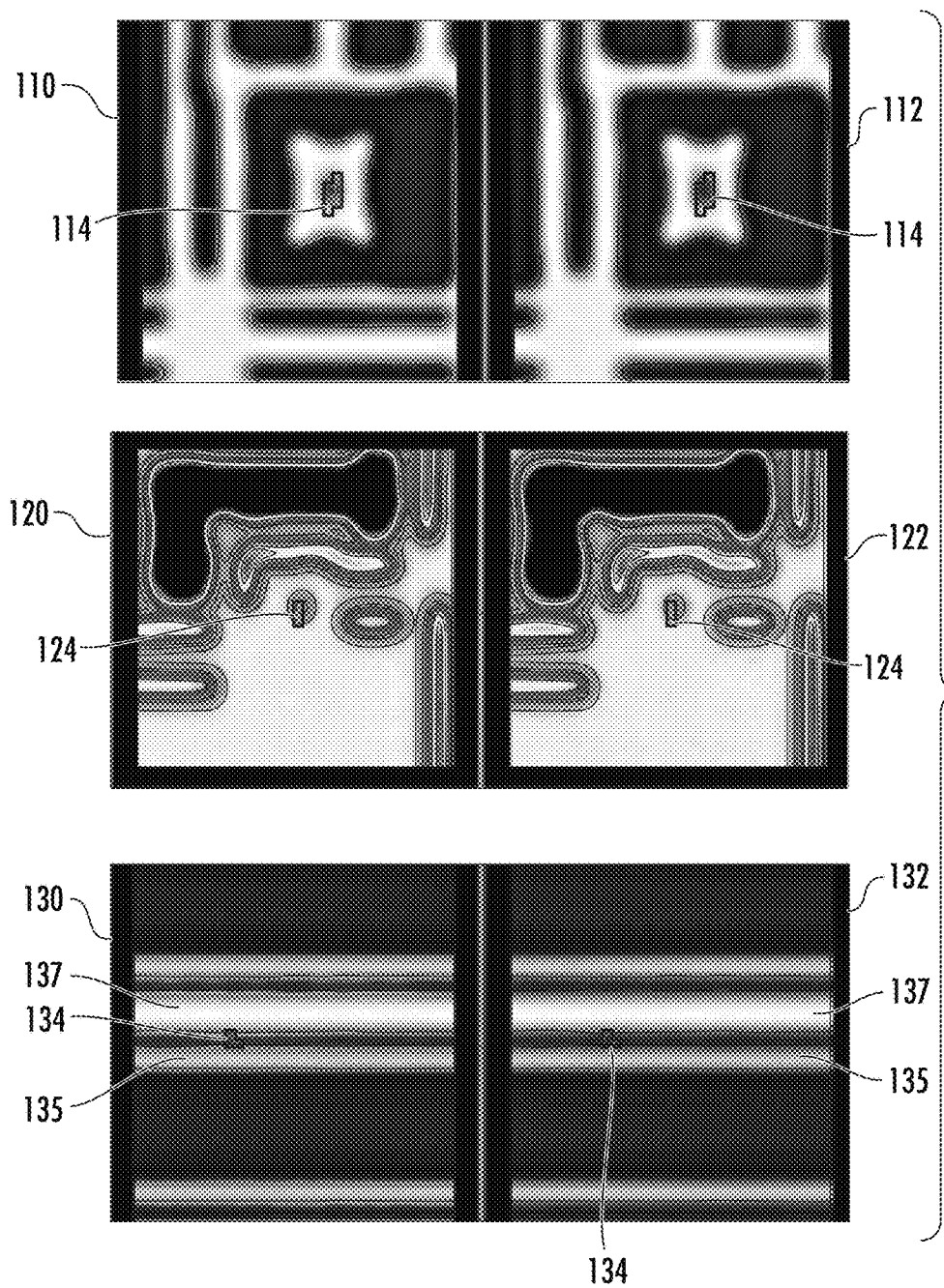
FIG. 1 shows example defects found in deep ultraviolet (DUV) masks, as known in the art.

The study also illustrates that small OPC features like SRAFs show discrepancies between mask inspection reference images and test images. For instance, an error flagged by a reference image may not reflect an actual error in a test image. Examples of DUV defects are shown in FIG. 1, where pairs of reference images and test images are shown. These images show how the reference image flags a potential error that the test image may not reflect. In these images, the locations of interest are outlined by an arbitrary polygonal shape indicating the location of the potential defect feature. Reference image 110 shows a scattering dot feature/defect 114, with corresponding test image 112 of the manufactured mask. Comparison of reference image 110 and test image 112 shows differences in dimension of feature/defect 114, resulting in the system flagging feature/defect 114. Similarly, reference image 120 and corresponding test image 122 depict a small curved SRAF 124 also illustrating differences in dimension between the reference image and test image. Reference image 130 depicts a smaller gap between an SRAF 135 (thinner line) and a main pattern 137 (thicker line) at location 134 compared to the remainder of the lines. In test image 132 the smaller distance between edges at location 134 is not present and may not indicate a defect.

Obtaining a scanner aerial image to determine mask defects can be achieved a few ways. Aerial plane mask inspection and emulation of scanner aerial images produce images close to those of a scanner. Forward simulation for both inspection tool optics and scanner optics are known and can be used to simulate mask inspection images and scanner aerial images, respectively. Other techniques include using inversion, which is iterative optimization to find a real mask pattern with a defect from its images captured by a mask inspection tool. Once the real mask pattern is known, the scanner aerial image can be simulated using a scanner optical model.

Figure 2:
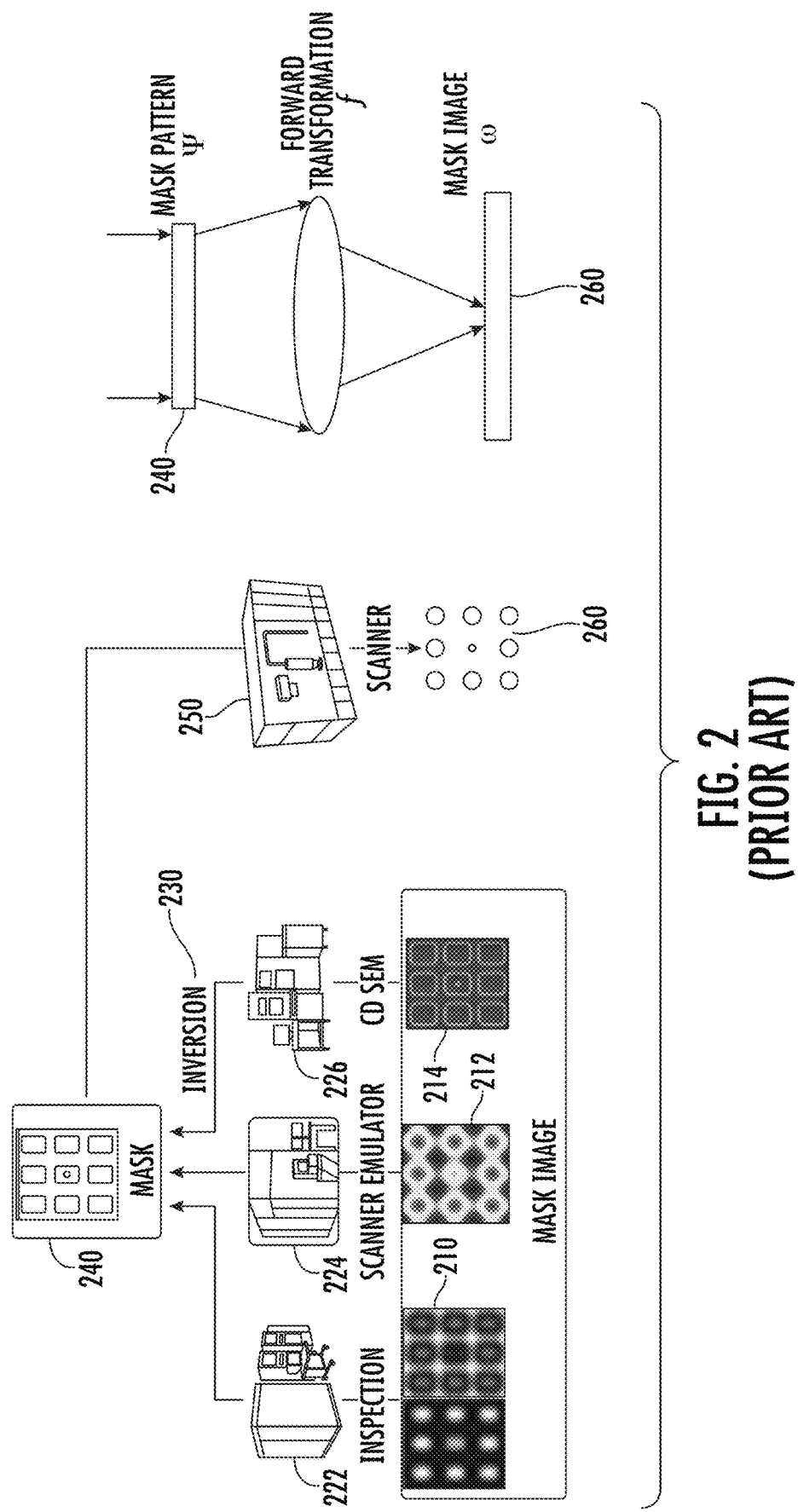
FIG. 2 is a diagram of mask inspection methods, as known in the art.

With inversion however, there is no unique solution. FIG. 2 shows a process using inversion, where mask images 210, 212 and 214 are attained by three methods—inspection 222, scanner emulator 224, and CD-SEM 226, respectively. Inversion 230 is used to find a real mask pattern 240, and a mask image 260 can be simulated using scanner 250. The diagram on the right-hand side of FIG. 2 illustrates simulation 255 (annotated as a forward transformation) between the mask pattern 240 and mask image 260. As shown in FIG. 2, inversion leverages the fact that DUV inspection tools have both transmitted and reflected imaging modes to help narrow down the solution. EUV inspection tools can only use reflected imaging, because the EUV wavelength 14 nm has a high absorption in nearly all materials, therefore, the multiple solution problem from inversion is much worse than DUV inspection tools with both transmitted and reflected images. Mask 3D effect for EUV is very strong and requires rigorous mask 3D simulation, therefore the run time is much longer than DUV simulation.

Leading-edge devices use increasingly more complex mask shapes to attain the required wafer shapes with adequate resilience to manufacturing variation. When mask shapes were largely Manhattan features where mask variation translated to wafer variation equally, determining disposition of mask discrepancy from mask design was largely a function of measuring CD on the mask. With increasing reliance on complex rectilinear or curvilinear shapes with sub-resolution assist features (SRAFs) on the mask, determining disposition of mask discrepancy requires wafer analysis. The ultimate check—test-printing the wafer—is difficult. Equipment that performs aerial-image analysis is available, but is expensive and resource-intensive, particularly for EUV masks.

Embodiments

In an embodiment of the present disclosure, two types of optical systems—the mask inspection/review system and the scanner—are modeled, and mask patterns plus defects are used to simulate the inspection images to determine the corresponding scanner aerial image to be printed on a wafer. The simulated inspection images and their corresponding scanner images are then used to train a neural network. In embodiments throughout this disclosure, the neural network can be a convolutional neural network, where the neural network can include a U-Net or a generative adversarial network (GAN).

Figure 3:
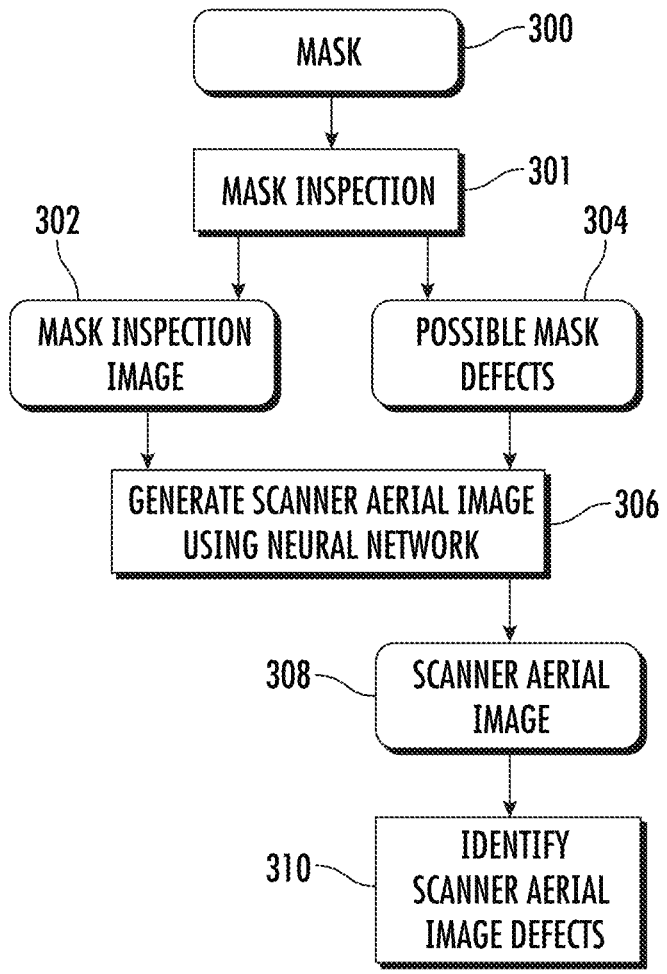
FIG. 3 is a flowchart of generating a scanner aerial image from an inspection mask image, in accordance with some embodiments.

Problems arising from accurately predicting the defect printability for EUV scanners are addressed in this disclosure using deep learning. In FIG. 3 which represents methods of determining a scanner aerial image from a mask, a mask inspection image 302 of a mask 300 from mask inspection 301 is input into a neural network. Mask inspection 301 produces mask inspection image 302 along with determining possible mask defects 304 (e.g., locations of possible mask defects). The neural network, which is trained as described herein, generates in block 306 a scanner aerial image 308. Scanner aerial image 308 may be a plurality of images of areas identified by mask defect locations 304. The neural network may also be trained to identify, in block 310, errors on the scanner aerial image 308 caused by the possible mask defects 304.

In embodiments of FIG. 3, the methods include inspecting, in mask inspection block 301, the mask 300 using a mask inspection machine (e.g., mask inspection machine shown in inspection 222 of FIG. 2), wherein the mask inspection machine outputs a mask inspection image 302. In some embodiments, the methods include inputting the mask inspection image, where the mask inspection image has been generated by the mask inspection machine. The methods also include generating, in block 306, the scanner aerial image 308 from the mask inspection image 302 using a neural network. Embodiments may include determining possible mask defect locations 304 during mask inspection 301, and identifying, in block 310, which of the possible mask defect locations 304 result in defects on the generated scanner aerial image 308. Some embodiments may include inputting a set of mask defect locations, wherein the set of mask defect locations has been generated by the mask inspection machine; and identifying which of the mask defect locations result in defects on the generated scanner aerial image. Embodiments also include training the neural network.

Figure 4A:
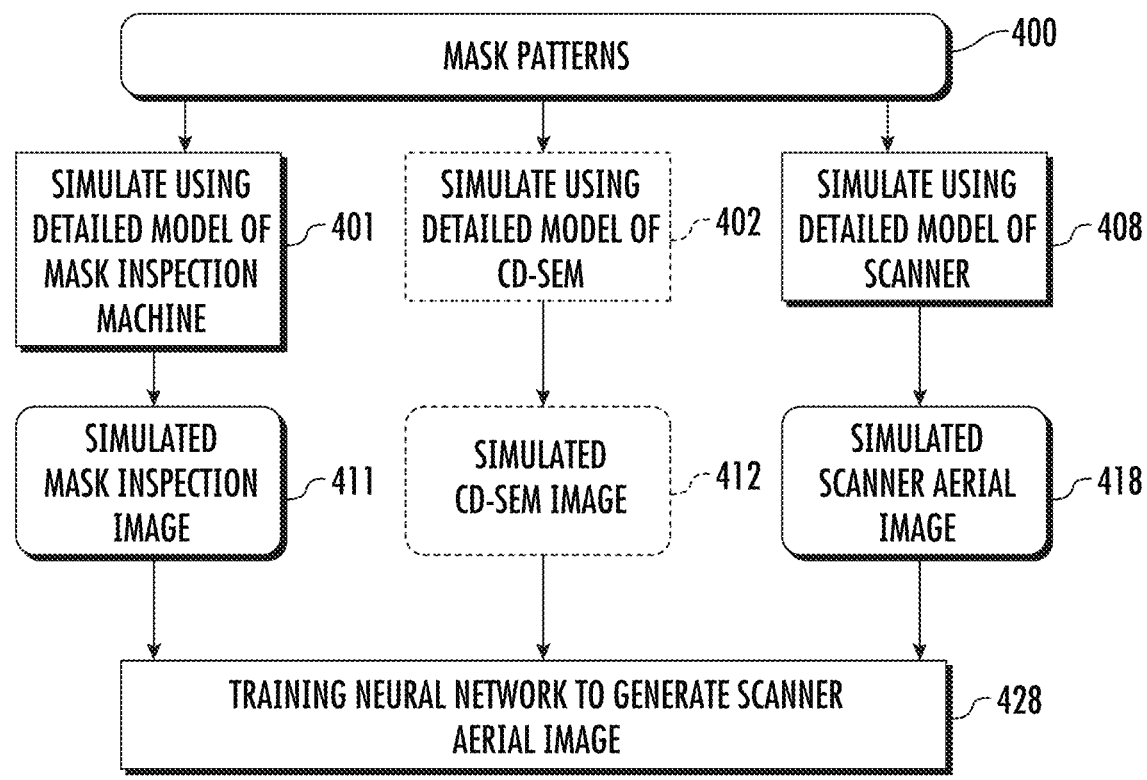
FIG. 4A is a flowchart of training a neural network for generating scanner aerial images from simulated inspection mask image/simulated scanner aerial image pairs, in accordance with some embodiments.

In FIG. 4A, using deep learning for training a neural network to generate a scanner aerial image in block 428 requires lots of data, for example pairs of labeled data: a simulated mask inspection image 411 and a corresponding simulated scanner aerial image 418 in this embodiment. The only way to acquire a real scanner image is to use a scanner which can be extremely expensive for EUV. Test printing with a scanner becomes more difficult with EUV. Obtaining such images through EUV emulation, an alternative approach, is not practical; furthermore, it is also expensive and too slow. However, the forward simulation for both mask inspection optics and scanner optics are well studied, and rigorous simulation, including the mask 3D effect, is very accurate.

Embodiments include utilizing a simulated mask inspection image as well as a simulated scanner aerial image to train a neural network to provide a more accurate scanner aerial image and faster than can be produced by conventional techniques or simulation alone.

Embodiments include inputting a plurality of mask patterns 400. In one embodiment, using mask patterns 400, the pairs of labeled data can be generated by running rigorous simulation of mask patterns 400 to simulate its mask inspection image 411 and the simulated scanner aerial image 418. As shown in FIG. 4A, block 401 involves simulating each pattern in the plurality of mask patterns using a detailed model of the mask inspection machine to create simulated mask inspection image 411. Block 408 involves simulating each pattern in the plurality of mask patterns using a detailed model of a scanner to create a simulated scanner aerial image 418. The method includes training the neural network in block 428 using corresponding pairs of simulated mask inspection images 411 and simulated scanner aerial images 418 (i.e., a corresponding pair being a simulated mask inspection image and a simulated scanner aerial image generated from the same mask pattern in the plurality of mask patterns). Similarly, optional block 402 involves simulating each pattern in the plurality of mask patterns using a detailed model of a CD-SEM to create a simulated CD-SEM image 412. This method includes training the neural network in block 428 using the corresponding pairs of simulated CD-SEM images 412 and simulated scanner aerial images 418. The method may also include training the neural network in block 428 using the simulated mask inspection image 411 combined with the simulated CD-SEM image 412 and the simulated scanner aerial images 418 for better accuracy.

Figure 4B:
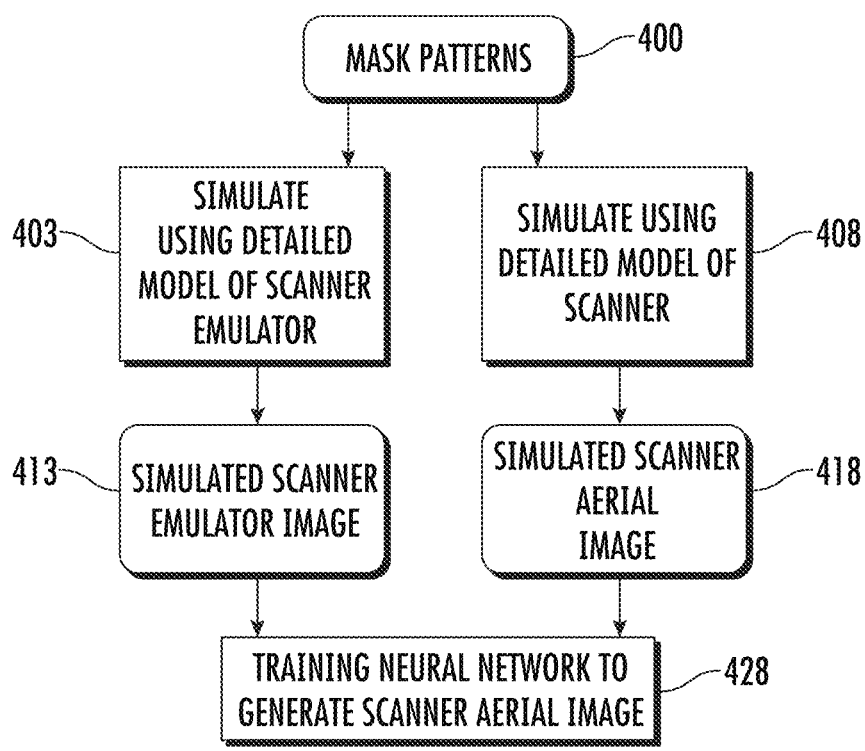
FIG. 4B is a flowchart of training a neural network for generating scanner aerial images from simulated scanner emulator image/simulated scanner aerial image pairs, in accordance with some embodiments.

In an embodiment illustrated in FIG. 4B, training the neural network to generate a scanner aerial image in block 428 may involve simulating (block 403) each pattern in the plurality of mask patterns 400 using a detailed model of a scanner emulator to create a simulated scanner emulator image 413. The method also includes simulating (block 408) each pattern in the plurality of mask patterns 400 using a detailed model of a scanner to create a simulated scanner aerial image 418. The simulated scanner emulator image 413 and simulated scanner aerial image 418 are used as input to train, in block 428, a neural network to generate a scanner aerial image.

Figure 4C:
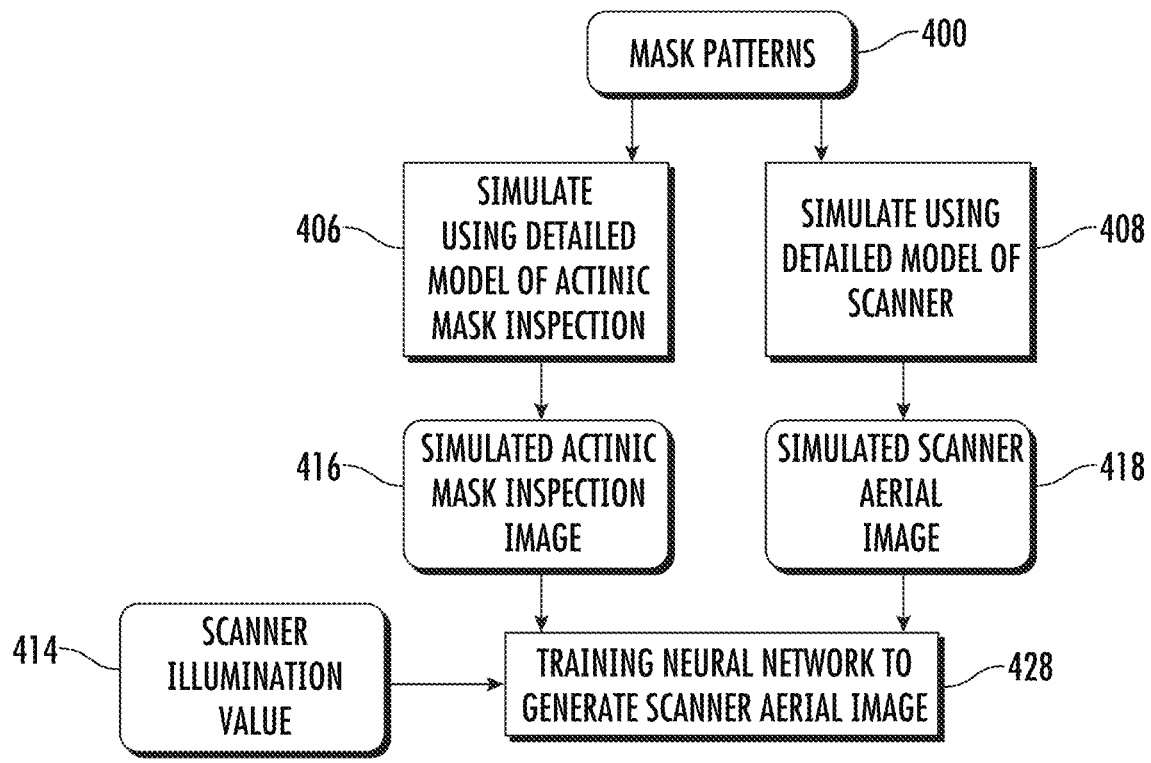
FIG. 4C is a flowchart of training a neural network for generating scanner aerial images from simulated actinic mask inspection image/simulated scanner aerial image pairs, in accordance with some embodiments.

In another embodiment illustrated in FIG. 4C, training the neural network to generate a scanner aerial image may involve simulating (block 406) each pattern in the plurality of mask patterns 400 using a detailed model of an actinic mask inspection machine to create a simulated actinic mask inspection image 416. The method also includes simulating (block 408) each pattern in the plurality of mask patterns 400 using a detailed model of a scanner to create a simulated scanner aerial image 418. Differences in EUV mask inspection and EUV scanners can be used to train the neural network, for example providing an illumination value 414 can be input to training the neural network with varying scanner illumination values.

Figure 5:
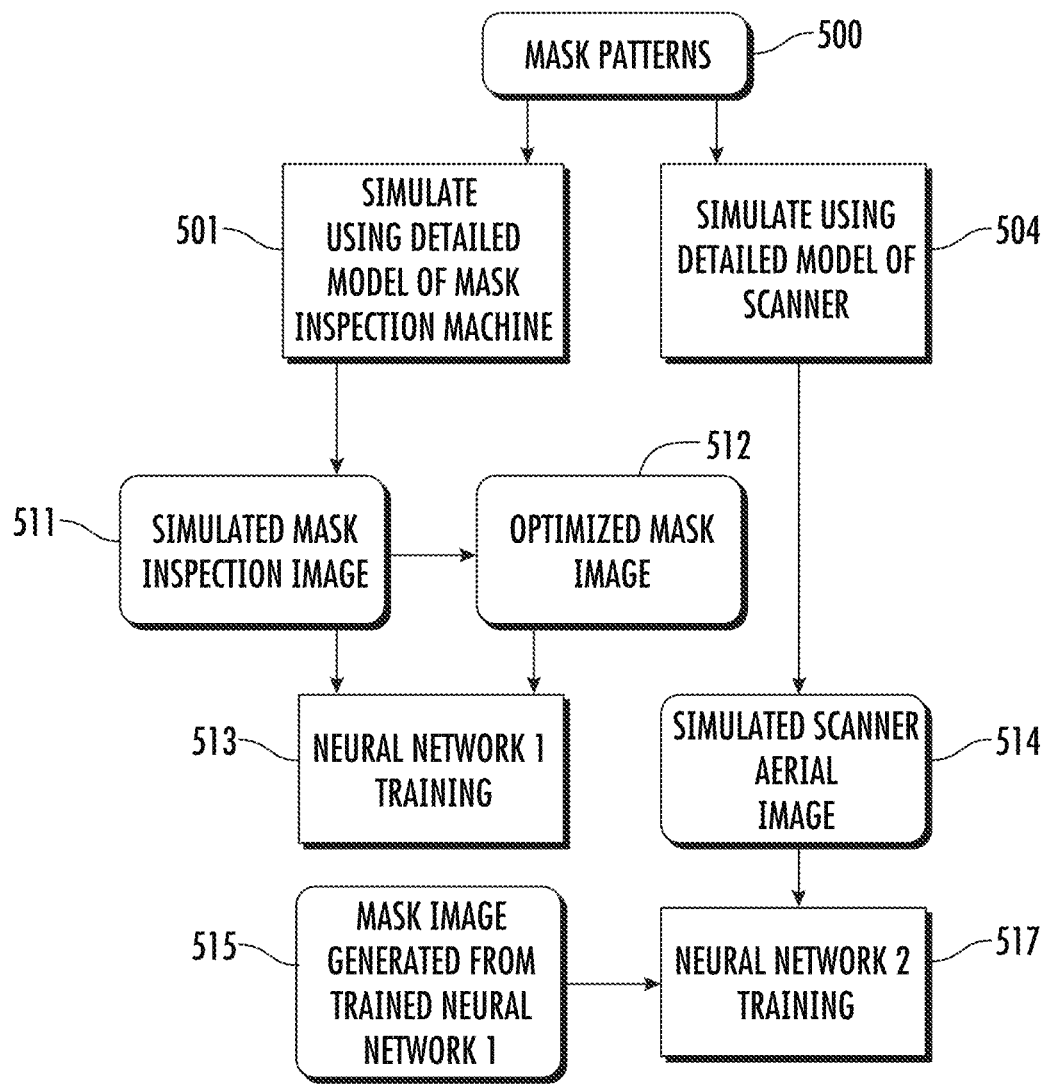
FIG. 5 is a is a flowchart of training a neural network for generating scanner aerial images from simulated mask inspection image/simulated scanner aerial image pairs, in accordance with some embodiments.

In another embodiment illustrated in FIG. 5, the single neural network of FIG. 4A can be replaced by a system of two neural networks. The method of FIG. 5 may include inputting a plurality of mask patterns 500. A first neural network is trained in a first neural network training 513 with a simulated mask image 511 and an optimized mask image 512 to generate a mask image 515. The optimized mask image 512 may be provided through source mask optimization (SMO) or inversion methods similar to ILT for example, and may be used for loss comparison against the generated mask 515 during training. A second neural network is trained to generate a scanner aerial image, where the training uses the mask image 515 (generated from the trained first neural network resulting from training 513) and a simulated scanner aerial image 514 (simulated using a detailed model of a scanner in block 504) in a second neural network training 517. The system of two neural networks may be used to generate interim images, i.e., the mask image, with more accuracy thus resulting in a more accurate scanner aerial image.

In embodiments of FIG. 5, a method for determining a scanner aerial image from a mask inspection image includes inputting the mask inspection image, wherein the mask inspection image is generated by a mask inspection machine; generating a mask image from the mask inspection image using a first neural network; and generating the scanner aerial image from the mask image using a second neural network. Embodiments may also include determining an optimized mask image from the mask inspection image, wherein the optimized mask image is used to train the first neural network. In further embodiments, the determining of the optimized mask image uses inversion.

Figure 6A:
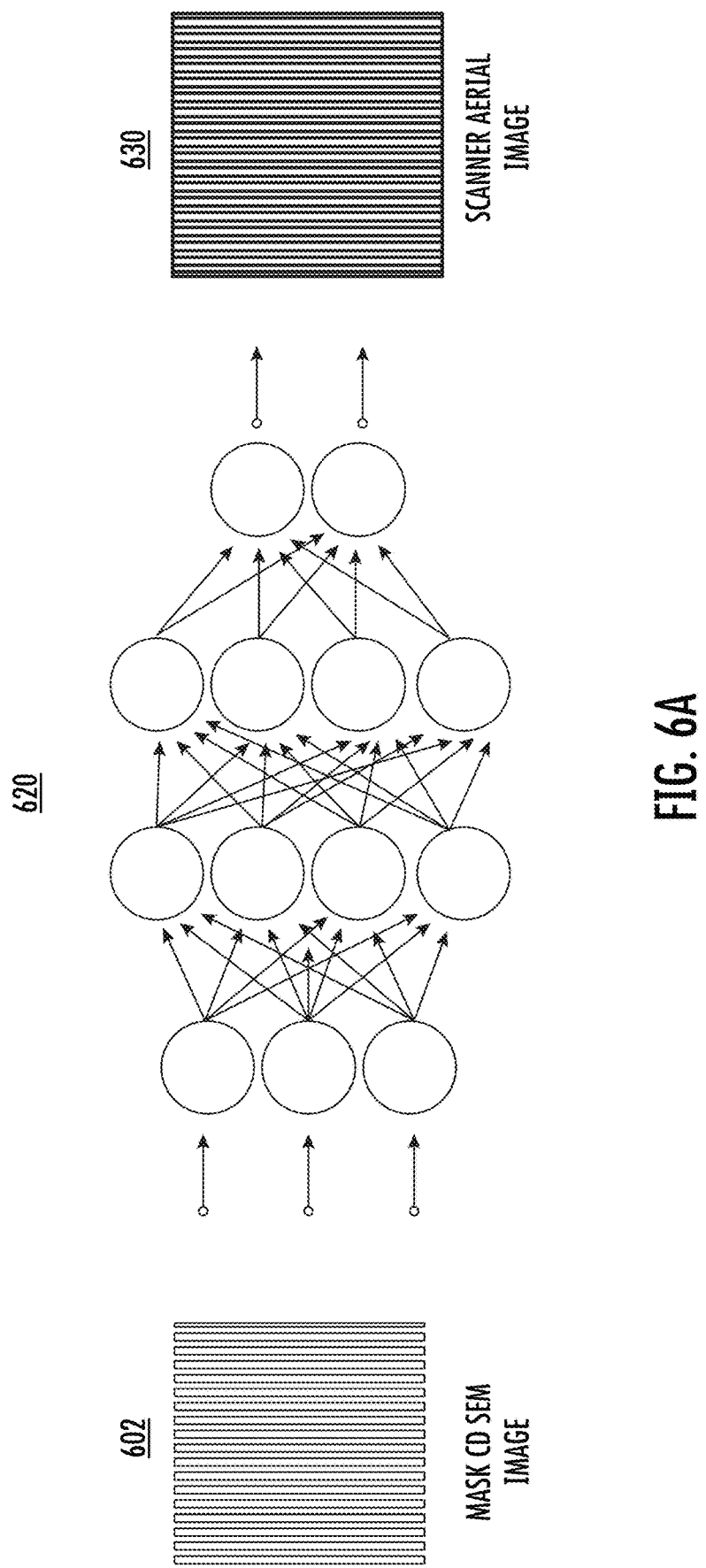
FIG. 6A is a diagram of generating a scanner aerial image from a Critical Dimension Scanning Electron Microscope (CD-SEM) image, in accordance with some embodiments.
Figure 6B:
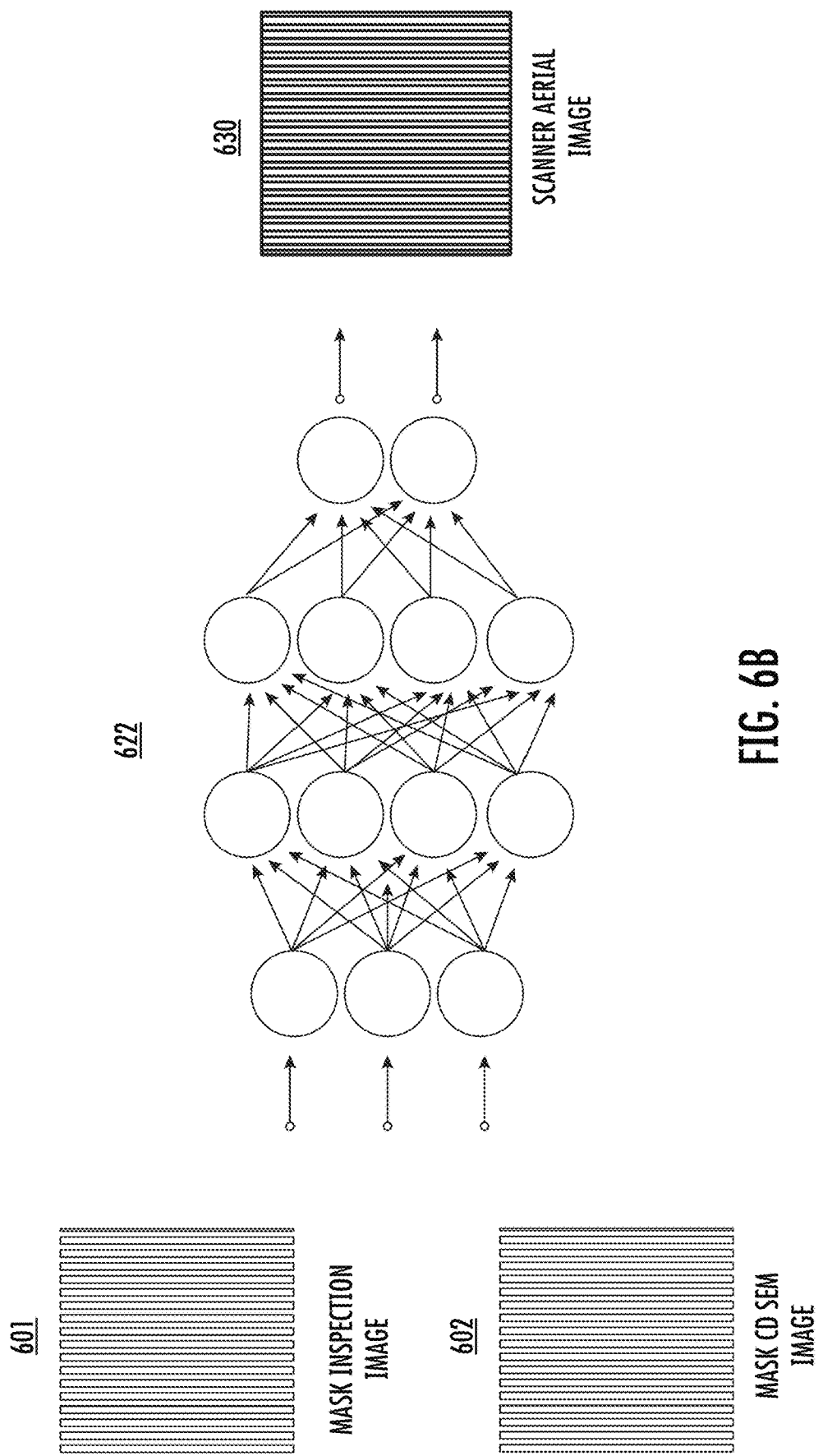
FIG. 6B is a diagram of generating a scanner aerial image from mask inspection image/CD-SEM image pairs, in accordance with some embodiments.

In another embodiment illustrated by FIG. 6A, by simulating for a mask Critical Dimension Scanning Electron Microscope (CD-SEM) to train a neural network 620, a scanner aerial image 630 can be predicted from a mask CD-SEM image 602. That is, neural network 620 may be trained as described in relation to FIG. 4A, where the simulated mask inspection image 411 can be substituted with the simulated mask CD-SEM image 412. In yet another embodiment as shown in FIG. 6B, a mask inspection image 601 can be combined with the mask CD-SEM image 602 and input into a trained neural network 622 to predict the scanner aerial images 630—to improve the accuracy of the predicted scanner aerial images 630. That is, neural network 622 may be trained as described in relation to FIG. 4A, where the simulated mask inspection image 411 and the simulated mask CD-SEM image 412 can be combined with the simulated mask inspection image 411 and the simulated scanner aerial image 418, respectively.

Figure 7:
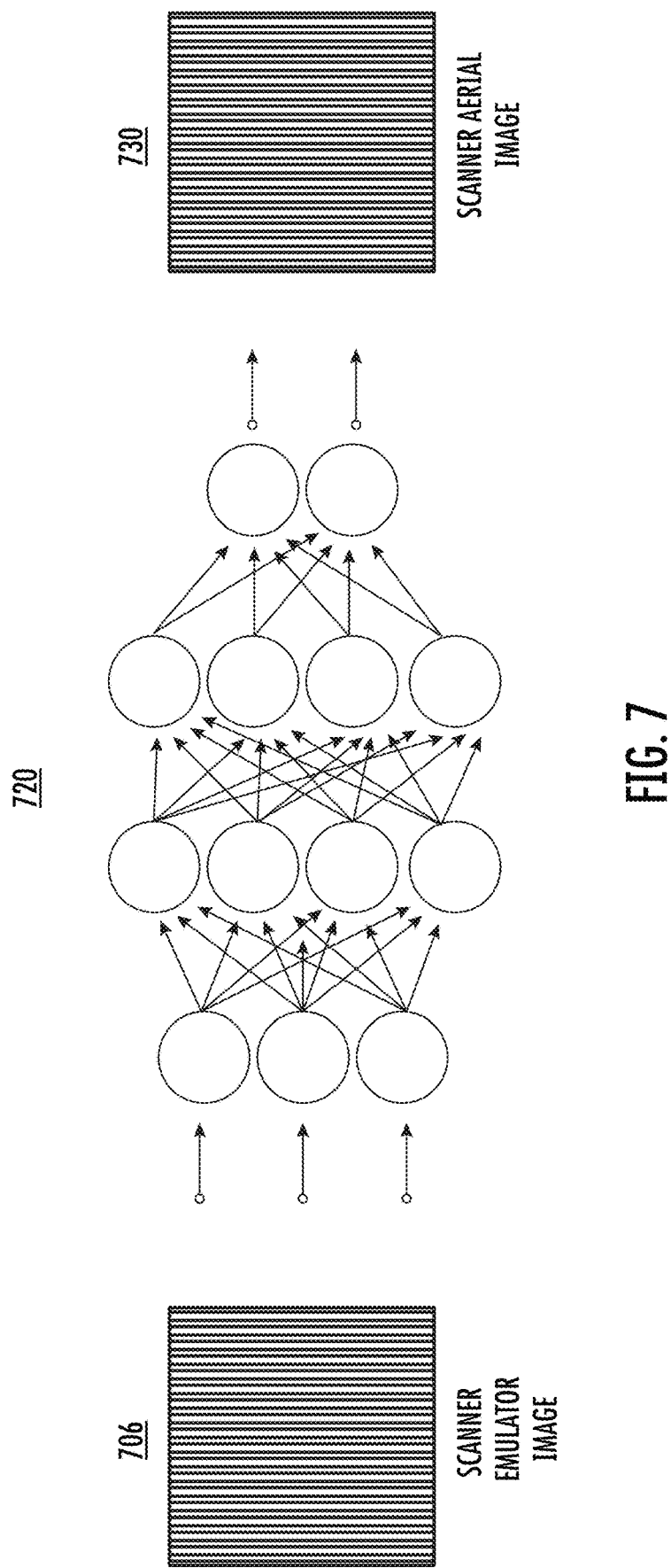
FIG. 7 is a diagram of generating a scanner aerial image from a scanner emulator image, in accordance with some embodiments.

Turning now to FIG. 7, even though optics used by EUV emulation is slightly different from the EUV scanner, both can be modeled accurately. Using simulation of an EUV scanner emulator to train a neural network 720, an EUV scanner emulator image 706 can then be input into the trained neural network 720 to predict scanner aerial image 730 more accurately than with the EUV scanner emulator alone. That is, neural network 720 may be trained as described in relation to FIG. 4B.

Figure 8:
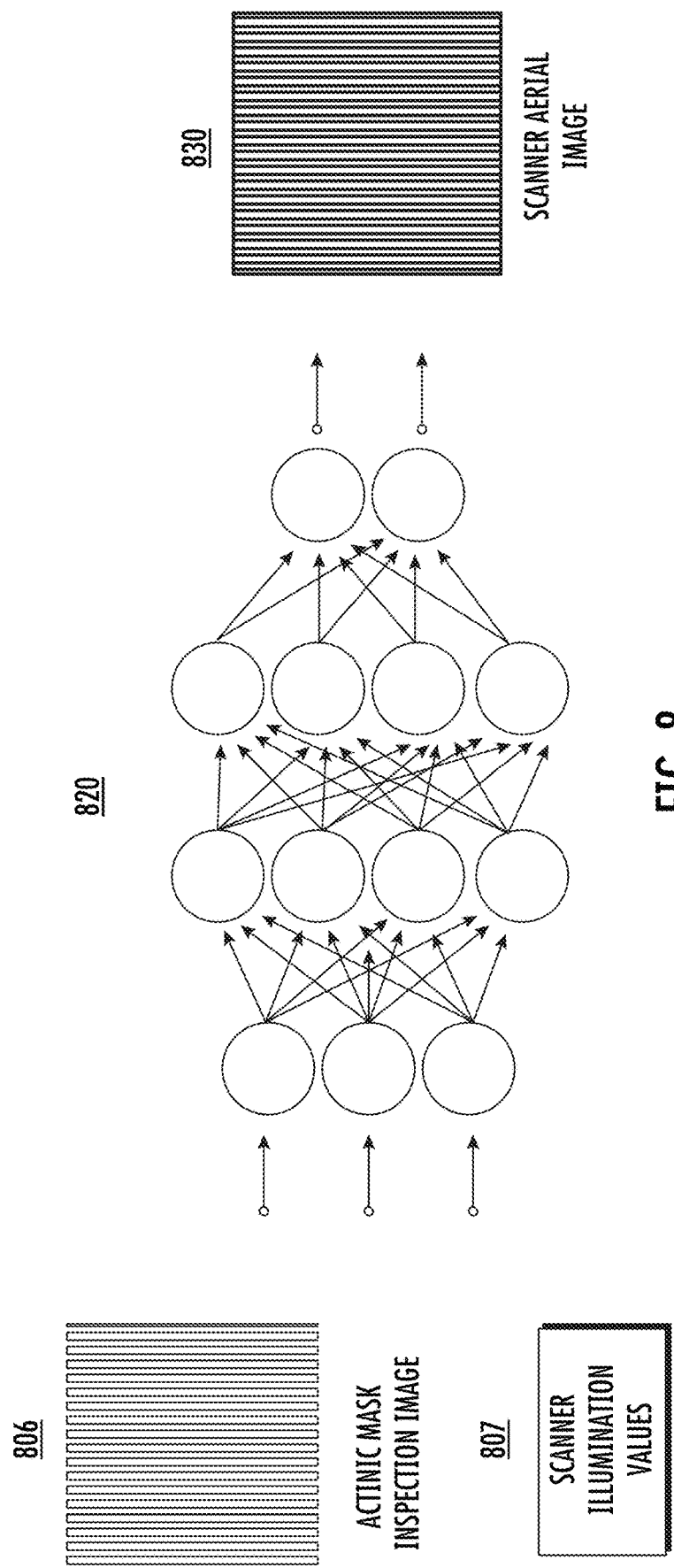
FIG. 8 is a diagram of transfer learning for scanner aerial image generation, in accordance with some embodiments.

In another embodiment shown in FIG. 8, using simulation of an EUV actinic mask inspection to train a neural network 820, an EUV actinic mask inspection image 806 can then be input into the trained neural network 820 to predict scanner aerial image 830. That is, neural network 820 may be trained as described in relation to FIG. 4C. Transfer learning may be leveraged to avoid re-training the neural network for different scanner illumination values 807. Different layers may use the same EUV scanner with different free form source optimized from SMO. This would require re-training the neural work since the scanner aerial image simulation result changes with different scanner illumination values. However, transfer learning of EUV actinic mask inspection image 806 can be leveraged to make a trained neural network 820 predict scanner aerial image 830 without re-training, using data simulated with scanner illumination values 807 as shown in FIG. 8.

In embodiments described throughout the disclosure, methods for determining a scanner aerial image include inputting a set of images and training a neural network with the set of images to generate the scanner aerial image. The set of images may include, for example, a simulated mask inspection image and a simulated scanner aerial image and may further include a simulated CD-SEM image. In another example, the set of images may include a simulated CD SEM image and a simulated scanner aerial image. In yet another example, the set of images may include a simulated scanner emulator image and a simulated scanner aerial image. In a further example, the set of images may include a simulated actinic mask inspection image and a simulated scanner aerial image; the method may further include inputting a scanner illumination value and training the neural network using the scanner illumination value.

Some embodiments include inputting a set of images that includes a first image and a second image. The first image in the set of images may be selected from the group consisting of a simulated mask inspection image, a simulated Critical Dimension Scanning Electron Microscope (CD-SEM) image, a simulated scanner emulator image and a simulated actinic mask inspection image. A second image in the set of images is a simulated scanner aerial image. A neural network is trained with the first image and the second image to generate the scanner aerial image A neural network can be trained to generate a scanner aerial image from simulated images. For example, a generative adversarial network (GAN) with a set of discriminators shown in FIG. 9A, along with a U-Net shown in FIG. 9B, can be used to generate the scanner image with extreme accuracy. In U.S. Pat. No. 11,250,199, entitled "Methods and Systems for Generating Shape Data for Electronic Designs" and which is hereby incorporated by reference, generating shape data by way of machine learning through a neural network can produce an accurate method of generation.

To generate accurate scanner aerial images, for example, a pair of training images, i.e., simulated inspection mask image and a corresponding simulated scanner aerial image, are used to train the model. The generator (e.g., generator

Figure 9A:
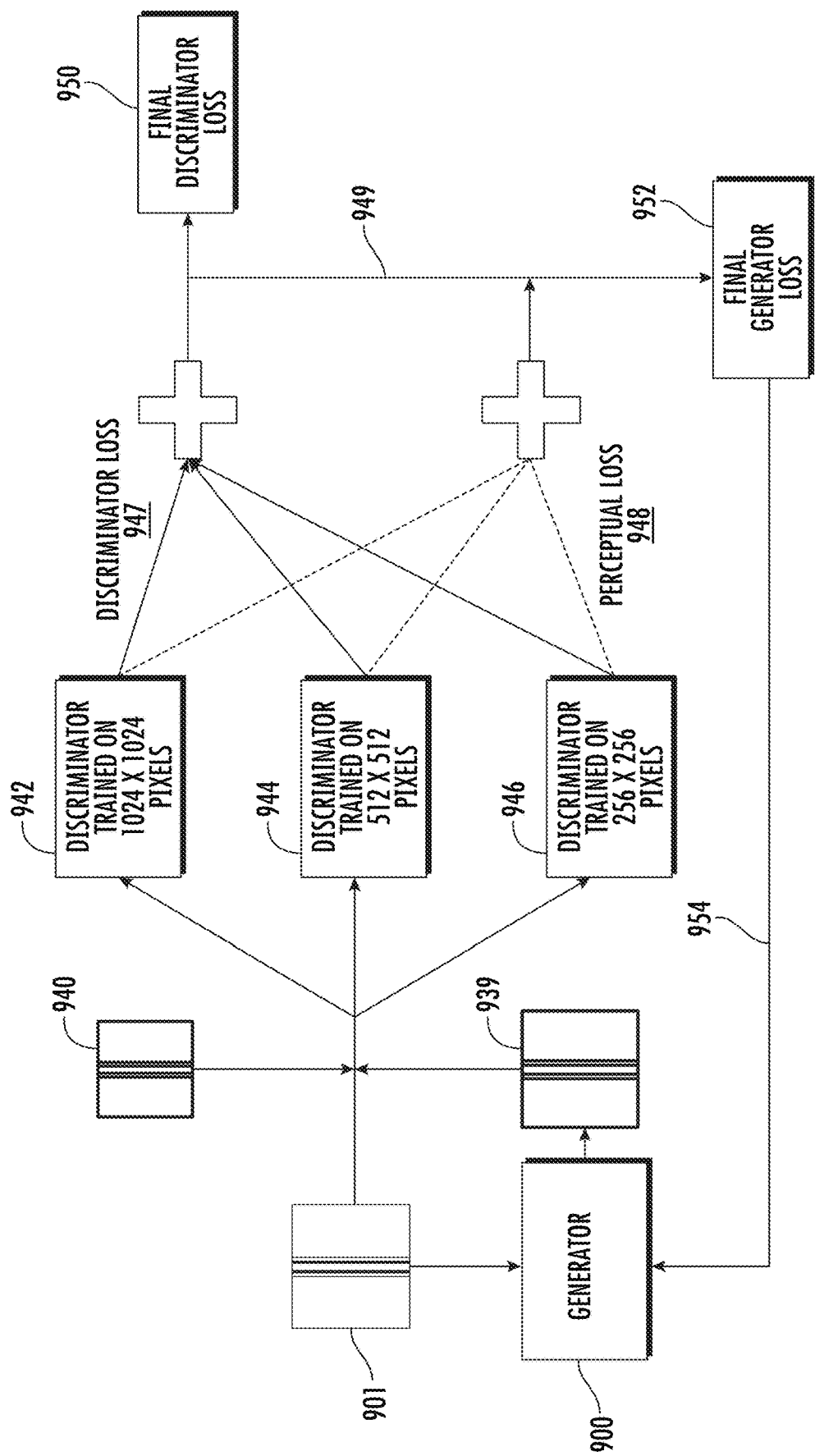
FIG. 9A is a diagram of a generative adversarial network (GAN), in accordance with some embodiments.

900 of FIG. 9A) takes the simulated data as input and tries to create an accurate scanner aerial image from it. The discriminator network takes the generated image and the simulated data as input. The discriminator network then classifies whether the image generated is fake or real.

In some embodiments, multiple discriminators with different input image sizes can be used to remove repeating patterns. FIG. 9A illustrates a model with multiple discriminators 942, 944 and 946 each handling different input image sizes which are sub-sampled from simulated image 901, such as a simulated mask image. Each discriminator outputs a discriminator loss 947 and a perceptual loss 948. The neural network further comprises a final discriminator loss 950 and a final generator loss 952. The final discriminator loss 950 combines together the discriminator losses 947 that are output from each of the three pre-determined discriminators. The different discriminators work as hard and soft critics for real or generated images. Each of the discriminators are trained to receive a different sized portion (e.g., 1, ½, and ¼) of the original image (real or generated) using, for example, a 70×70 receptive field for patch penalization (which would need to be doubled in the original image size for each reduced portion, 140×140 for the ½ size portion and 280×280 for the ¼ size portion). The differences in patch penalization allows for more correct features and noise dispersion. With only one discriminator the network learns quickly, and the generator 900 keeps generating images that are easily classified as fake. With multiple discriminators, each discriminator in the present embodiments is configured to have different receptive fields, smaller to larger, based on sub-sampling. At least one of the discriminators out of the three or more might not be certain that an image is fake, thus helping the generator learn. Multiple discriminators also reduce the occurrence of repeating patterns in the generated images as seen in models with a single discriminator. A generated scanner aerial image 939 can then be compared to a real scanner aerial image 940 to determine the accuracy of the generator/discriminator neural network. That is, in some embodiments, methods involve inputting an actual SEM image, where the actual SEM image is used by the pre-determined set of discriminators to compare with the set of generated shape data.

The multiple discriminators are pre-determined; that is, the set of discriminators are pre-determined in the image size they will handle and the types of layers and blocks they are configured with. In the embodiment of FIG. 9A, a first pre-determined discriminator 942 is trained with 1024×1024 pixel images, a second pre-determined discriminator 944 is trained with 512×512 pixel images, and a third pre-determined discriminator 946 is trained with 256×256 pixel images. Each discriminator comprises multiple layers or classifier blocks. For example, each discriminator may include a plurality of classifier blocks. In some embodiments, a first block (initial layer) contains a convolutional layer, a leaky rectified linear activation unit (ReLU) activation layer and a padding layer. In addition, subsequent layers include a batch normalization layer. The final layer contains a convolutional layer, a padding layer and a sigmoid activation layer. In addition, the size of the input to each discriminator is halved in only the first 2 layers and reduced by 1 in width and height in each subsequent layer. The discriminators may comprise a kernel size of 4×4 and channels (depth) varying from 6, 64, 128, 256 and capped at 512 to preserve memory. In an example embodiment, a second block, a third block, a fourth block, a fifth block and a sixth block each include a convolution layer, a batch normalization layer, a leaky ReLU activation layer and a padding layer; and a seventh block includes a convolution layer, a padding layer and a sigmoid activation layer. The number of blocks may be chosen to balance accuracy with efficiency of training. For example, at a certain number of blocks the increased computation time from adding more blocks may not provide significant gain in the results produced.

Figure 9B:
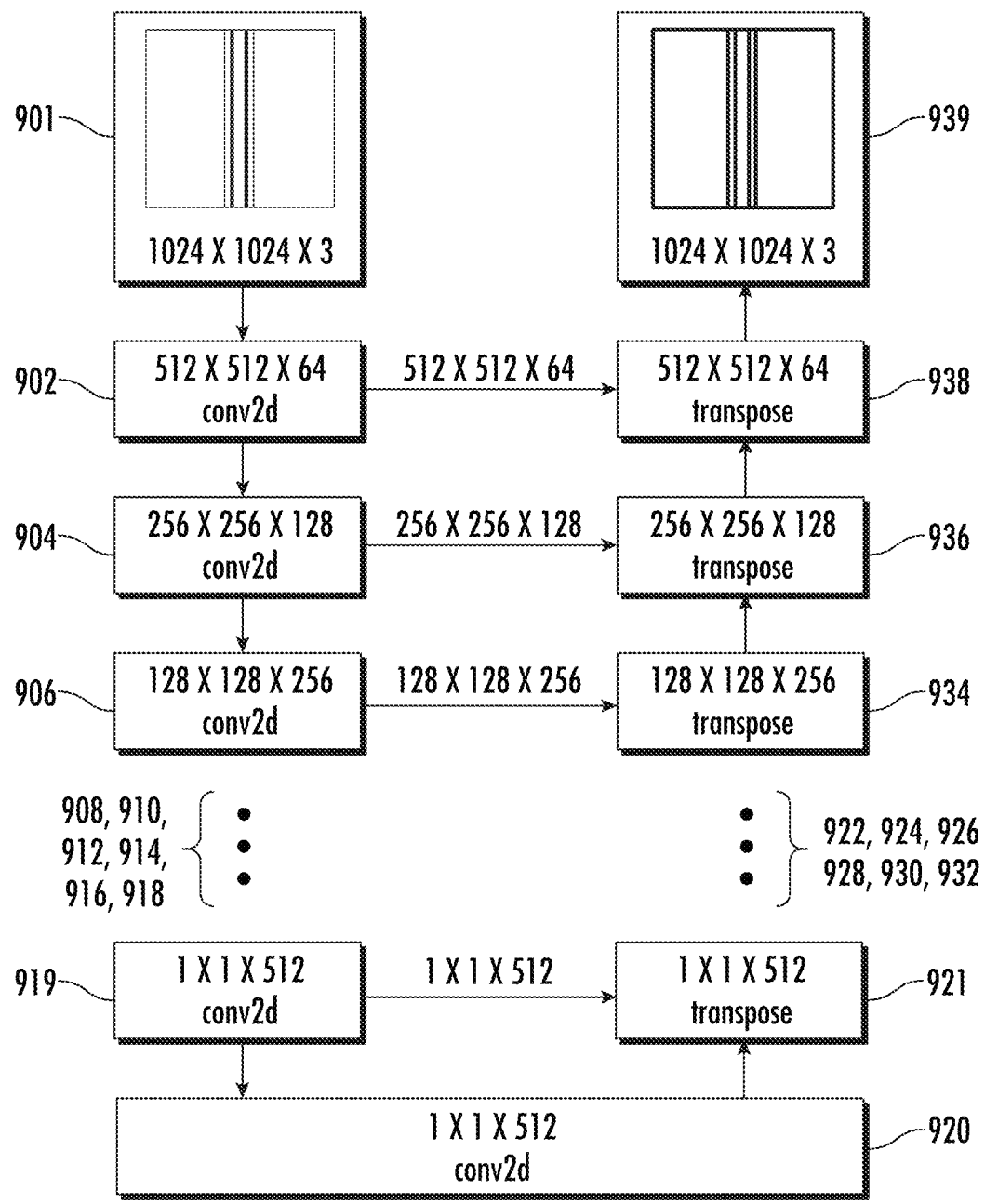
FIG. 9B is a diagram of a U-Net, in accordance with some embodiments.

In some embodiments, methods involve inputting a set of shape data, such as a simulated image 901, where the set of shape data represents a set of shapes for a device fabrication process, and inputting a set of parameters including a set of convolution layers for a conditional generative adversarial network (CGAN) (e.g., convolution layers with encoder blocks 902-919 and 921-938 of the U-net of FIG. 9B). The methods also involve generating a scanner aerial image 939 with the set of shape data such as a simulated image 901, by using the set of convolution layers of the CGAN. The methods further involve calculating a loss comprising a perceptual loss 948 (FIG. 9A) combined with a portion 949 of an accumulated discriminator loss 950, and adjusting the set of parameters including the set of convolution layers. The adjusting may be performed by repeating a loop 954 from the final generator loss 952 to generator 900. The parameters that may be adjusted in training the CGAN include, for example, learning rates, perceptual loss weights, and the number of discriminators. In some embodiments the set of parameters comprises a kernel size of 4×4 with channels varying from 3, 64, 128, 256 and 512 for each convolution layer. For example, encoder layers may increase from 3 channels to 64, 128, 256 and 512 in following encoder layers, while decoder layers may decrease from 512 channels to 256, 128, 64 and 3 in following decoder layers.

A more detailed embodiment of the generator 900 of FIG. 9A is illustrated in FIG. 9B. Methods involve using the generator 900 to create the set of generated shape data, where the generator includes an encoder and a decoder. A simulated image 901 (i.e., set of shape data, such as a simulated mask image or simulated CAD data) is input to the encoder (made of encoder blocks 902, 904, 906, 908, 910, 912, 914, 916, 918 and 919), and a scanner aerial image 939 is output from the decoder (made of decoder blocks 921, 922, 924, 926, 928, 930, 932, 934, 936 and 938). The generator 900 is comprised of multiple encoder blocks 902, 904, 906 continuing through blocks 908, 910, 912, 914, 916, 918 and 919 up to 10 blocks, reducing the image to 1×1 with a maximum 512 channels in the bottleneck layer 920, followed by multiple decoder blocks 921 continuing through blocks 922, 924, 926, 928, 930, 932, 934, 936 and 938 for up to 10 blocks. The maximum number of blocks is used to convolve an image of 1024 pixels to 1 pixel with 512 channels to get a better representation of the input image. Except for the initial encoder block 902, each encoder block (for example, blocks 904-919) after the first encoder block 902 comprises a convolutional layer, a batch normalization layer and a leaky ReLU (Rectified Linear Unit) activation layer. All decoder blocks from 921-938 comprise a transpose convolution layer. The initial decoder block 921 has a transpose convolution layer and a ReLU activation layer. The subsequent blocks after the initial decoder block 921 in a first set of decoder blocks (e.g., the first half of 10 decoder blocks 922-928) contain a transpose convolution layer, a batch normalization layer and a ReLU activation layer. A second set of the decoder blocks (e.g., the second half of 10 decoder blocks 930-938) comprise the same layers as the first set, plus a dropout layer. The encoder and decoder may comprise up to 10 blocks each with a kernel size of 4×4 and channels (depth) varying from 3, 64, 128, 256 and capped at 512 to preserve memory. For example, encoder blocks may successively increase from 3 channels in a first encoder block to 64 channels, 128 channels, 256 channels and 512 channels in subsequent encoder blocks. Similarly, decoder blocks may successively decrease from 512 channels in a first decoder block to 256, 128, 64 and 3 channels in subsequent decoder blocks.

Figure 10:
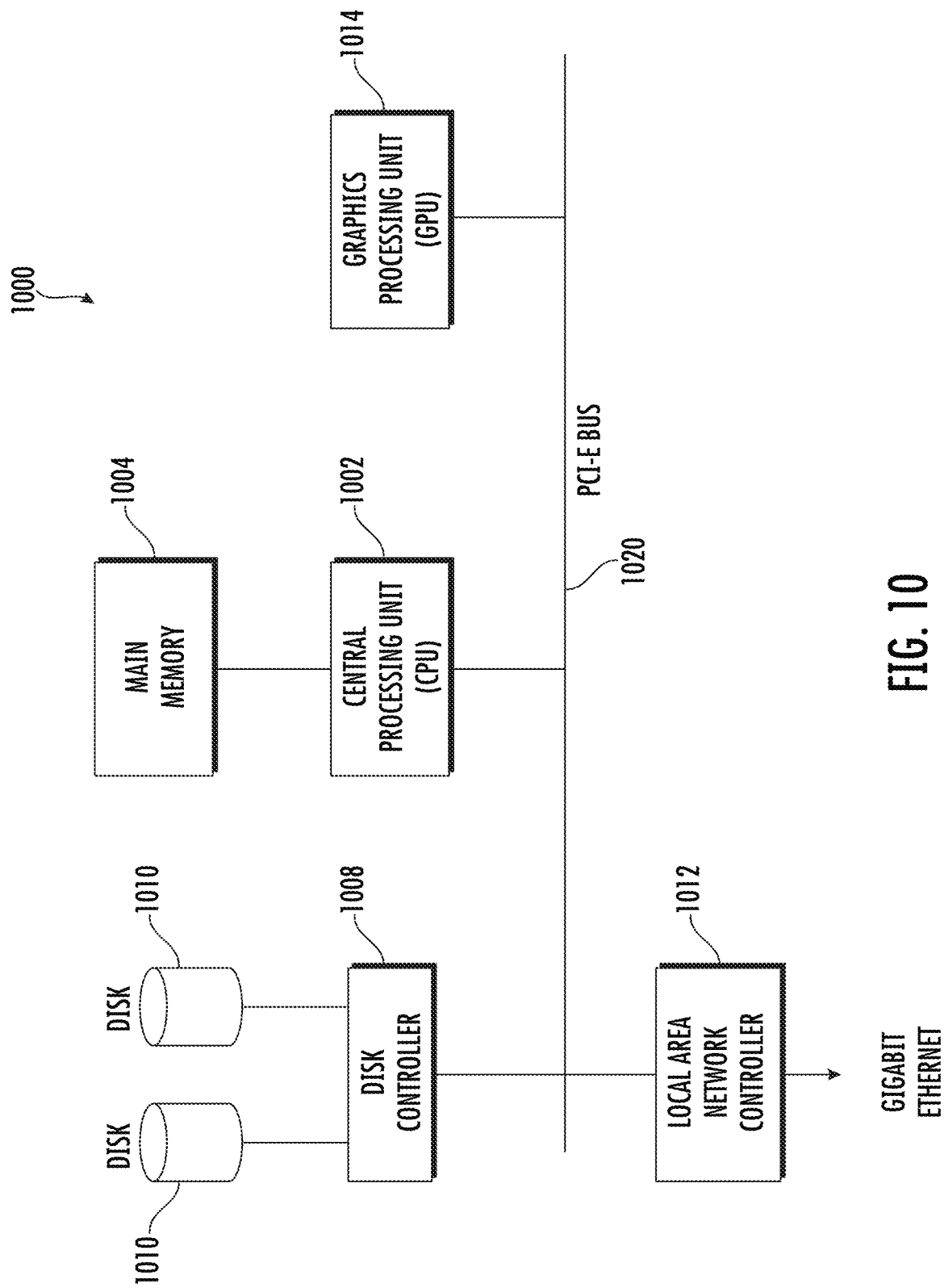
FIGS. 10 and 11 are schematics of GPU systems, in accordance with some embodiments.

FIG. 10 illustrates an example of a computing hardware device 1000 that may be used to perform the calculations described in this disclosure. Computing hardware device 1000 comprises a central processing unit (CPU) 1002, with attached main memory 1004. The CPU may comprise, for example, eight processing cores, thereby enhancing performance of any parts of the computer software that are multi-threaded. The size of main memory 1004 may be, for example, 64 G-bytes. The CPU 1002 is connected to a Peripheral Component Interconnect Express (PCIe) bus 1020. A graphics processing unit (GPU) 1014 is also connected to the PCIe bus. In computing hardware device 1000 the GPU 1014 may or may not be connected to a graphics output device such as a video monitor. If not connected to a graphics output device, GPU 1014 may be used purely as a high-speed parallel computation engine. The computing software may obtain significantly higher performance by using the GPU for a portion of the calculations, compared to using CPU 1002 for all the calculations. The CPU 1002 communicates with the GPU 1014 via PCIe bus 1020. In other embodiments (not illustrated) GPU 1014 may be integrated with CPU 1002, rather than being connected to PCIe bus 1020. Disk controller 1008 may also be attached to the PCIe bus, with, for example, two disks 1010 connected to disk controller 1008. Finally, a local area network (LAN) controller 1012 may also be attached to the PCIe bus, and provides Gigabit Ethernet (GbE) connectivity to other computers. In some embodiments, the computer software and/or the design data are stored on disks 1010. In other embodiments, either the computer programs or the design data or both the computer programs and the design data may be accessed from other computers or file serving hardware via the GbE Ethernet.

Figure 11:
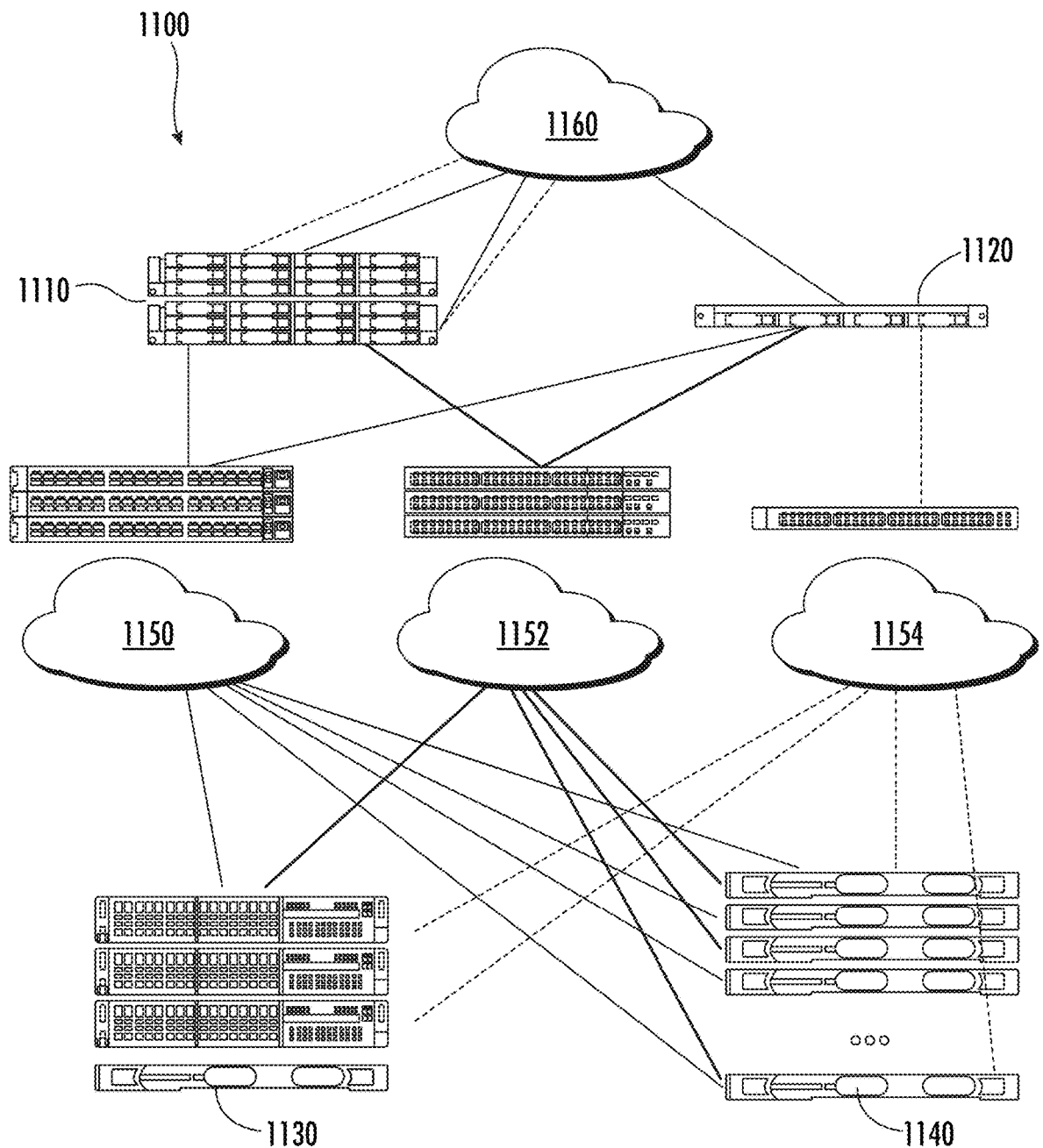

FIG. 11 is another embodiment of a system for performing the computations of the present embodiments. The system 1100 may also be referred to as a CDP, and includes a master node 1110, an optional viewing node 1120, an optional network file system 1130, and a GPU-enabled computing node 1140. Viewing node 1120 may not exist or instead have only one node, or may have other numbers of nodes. GPU-enabled computing node 1140 can include one or more GPU-enabled nodes forming a cluster. Each GPU-enabled computing node 1140 may comprise, for example, a GPU, a CPU, a paired GPU and CPU, multiple GPUs for a CPU, or other combinations of GPUs and CPUs. The GPU and/or CPU may be on a single chip, such as a GPU chip having a CPU that is accelerated by the GPU on that chip, or a CPU chip having a GPU that accelerates the CPU. A GPU may be substituted by another co-processor.

The master node 1110 and viewing node 1120 may be connected to network file system 1130 and GPU-enabled computing nodes 1140 via switches and high-speed networks such as networks 1150, 1152 and 1154. In an example embodiment, networks 1150 can be a 56 Gbps network, 1152 can be a 1 Gbps network and 1154 can be a management network. In various embodiments, fewer or greater numbers of these networks may be present, and there may be various combinations of types of networks such as high and low speeds. The master node 1110 controls the CDP 1100. Outside systems can connect to the master node 1110 from an external network 1160. In some embodiments, a job may be launched from an outside system. The data for the job is loaded onto the network file system 1130 prior to launching the job, and a program is used to dispatch and monitor tasks on the GPU-enabled computing nodes 1140. The progress of the job may be seen via a graphical interface, such as the viewing node 1120, or by a user on the master node 1110. The task is executed on the CPU using a script which runs the appropriate executables on the CPU. The executables connect to the GPUs, run various compute tasks, and then disconnect from the GPU. The master node 1110 may also be used to disable any failing GPU-enabled computing nodes 1140 and then operate as though that node did not exist.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods may be practiced by those of ordinary skill in the art, without departing from the scope of the present subject matter, which is more particularly set forth in the appended claims. Furthermore, those of ordinary skill in the art will appreciate that the foregoing description is by way of example only and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for determining a scanner aerial image from a mask inspection image, the method comprising:
   inputting the mask inspection image, wherein the mask inspection image has been generated by a mask inspection machine; and
   generating the scanner aerial image from the mask inspection image using a neural network.

2. The method of claim 1, further comprising:
   inputting a set of mask defect locations, wherein the set of mask defect locations has been generated by the mask inspection machine; and
   identifying which mask defect locations of the set of mask defect locations result in defects on the generated scanner aerial image.

3. The method of claim 1, further comprising training the neural network, the method comprising:
   inputting a plurality of mask patterns;
   simulating each pattern in the plurality of mask patterns using a detailed model of the mask inspection machine to create a simulated mask inspection image;
   simulating each pattern in the plurality of mask patterns using a detailed model of a scanner to create a simulated scanner aerial image; and
   training the neural network using corresponding pairs of the simulated mask inspection images and the simulated scanner aerial images.

4. A method for determining a scanner aerial image, the method comprising:
   inputting a set of images, wherein a first image in the set of images is selected from the group consisting of a simulated mask inspection image, a simulated Critical Dimension Scanning Electron Microscope (CD-SEM)

image, a simulated scanner emulator image and a simulated actinic mask inspection image; and wherein a second image in the set of images is a simulated scanner aerial image; and training a neural network with the first image and the second image to generate the scanner aerial image.

5. The method of claim 4, further comprising inputting a scanner illumination value, wherein the training comprises using the scanner illumination value.

6. The method of claim 4, wherein the neural network comprises a convolutional neural network.

7. The method of claim 4, wherein the neural network comprises a U-Net.

8. The method of claim 4, wherein the neural network comprises a generative adversarial network (GAN).

9. A method for determining a scanner aerial image from a mask inspection image, the method comprising:

inputting the mask inspection image, wherein the mask inspection image is generated by a mask inspection machine;

generating a mask image from the mask inspection image using a first neural network; and generating the scanner aerial image from the mask image using a second neural network.

10. The method of claim 9, further comprising determining an optimized mask image from the mask inspection image, wherein the optimized mask image is used to train the first neural network.

11. The method of claim 10, wherein the determining of the optimized mask image uses inversion.

\* \* \* \* \*